US 6,650,011 B2

(12) United States Patent
Partosa et al.

(10) Patent No.: US 6,650,011 B2
(45) Date of Patent: Nov. 18, 2003

(54) POROUS CERAMIC WORK STATIONS FOR WIRE AND DIE BONDERS

(75) Inventors: Raymond M. Partosa, Baguio (PH); Allan C. Soriano, Baguio (PH); Enrique R. Ferrer, Jr., Baguio (PH); Ramil A. Viluan, Baguio (PH); Melvin B. Alviar, Baguio (PH); Jose Franco A. Alicante, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/056,204

(22) Filed: Jan. 25, 2002

(65) Prior Publication Data

US 2003/0140470 A1 Jul. 31, 2003

(51) Int. Cl.[7] .............................................. H01L 23/15
(52) U.S. Cl. ..................................................... 257/703
(58) Field of Search ...................... 438/14; 250/492.23; 355/52; 257/703

(56) References Cited

U.S. PATENT DOCUMENTS 6,015,976 A * 1/2000 Masahiro ............... 250/492.23
6,229,595 B1 * 5/2001 McKinley et al. ............ 355/53

* cited by examiner

Primary Examiner—John F. Niebling
Assistant Examiner—Andre C Stevenson
(74) Attorney, Agent, or Firm—Michael K. Skrehot; Wade James Brady, III; Frederick J. Telecky, Jr.

(57) ABSTRACT

A work station for a chip bonder, and/or for a wire bonder includes a clampless, porous ceramic vacuum chuck where the substrate under assembly is securely and uniformly held by vacuum applied through many tiny pores distributed across the work surface. Porous ceramic work stations are applicable to a family of packages, or to a substrate outline, and may include one or more chips within the same indexing operation. Reliability and yield of the assembled semiconductor devices is enhanced by avoiding uneven or warped substrates. In addition, the porous ceramic work holder provides a cost effective apparatus by eliminating device specific clamps and work holders, the time required for change-out and set-up.

20 Claims, 3 Drawing Sheets

POROUS CERAMIC WORK STATIONS FOR WIRE AND DIE BONDERS

FIELD OF THE INVENTION

This invention relates generally to semiconductor devices, and more particularly to equipment used in the assembly of semiconductor devices.

BACKGROUND OF THE INVENTION

In the fabrication of most semiconductor devices, a chip or die is mechanically and electrically connected to the leads of a substrate prior to sealing the device in a protective package. Electrical contact is made between the conductive pads on the active face of the chip and external leads of a substrate. The two major pieces of automated equipment, i.e. chip and wire bonders, used to connect the chip and substrate have many variations, but are similar in that the work stations of each apparatus must hold the device under assembly securely against the work surface during the operation.

In the operation of a chip bonder, a substrate is positioned onto a work station where an adhesive, an alloy, or other type of mount material is disposed onto a predetermined location, and a semiconductor chip is positioned atop the adhering material. Typically the work station includes a vacuum chuck having a planar surface of approximately the size and shape of the substrate, and has one or more apertures connected to a vacuum source. Failure to secure the substrate a flat and horizontal position during chip mounting can cause the chip to he misplaced and/or tilted, which subsequently can lead to failures at the wire bonding process.

An automated wire bonder interconnects the input/output (I/O) pads of a semiconductor chip to specified leads on a substrate by fine wires. The substrate must be held tightly against a moveable heater block which serves as a mass forming a fixed and unyielding mandrel so that the semiconductor and the lead to be bonded are firmly clamped. Proper thermosonic wire bonds at the first and second bonding sites are a function of time, force, and ultrasonic power applied through the bonding tool to the wire being bonded. Heating the semiconductor die or substrate is known to reduce the bonding time, and generally improve the bond quality. Failure to securely hold the substrates and chips during wire bonding will lead to poorly formed bonds, broken or lifted wires.

In existing wire bonding apparatus, devices are held by device specific inserts which form the work holder. Typically the inserts are of a metallic composition machined to form a heated work surface with features which conform to the specific device substrate under assembly. A clamp holds the substrate to the work surface. Both the clamp and insert are specific to the dimensions and features of the device under assembly. Vacuum assist may be used to help locate and secure the substrate.

As packaging of semiconductor devices has become more diverse and complex, the devices usually are thinner, and thus the necessity to provide a flat, parallel surface has become more challenging. In older technologies, the substrates were rigid materials, such as ceramics or thick metal lead frames, but in more current devices, substrates often are made of a flexible film, a thin composite or laminate polymer, or a thin lead frame of malleable material which tends to warp and bend under uneven pressure of clamps and large vacuum apertures. Further, substrates may be configured so that multiple devices are assembled in parallel. Edge clamps and work surfaces with vacuum apertures may cause distortion of the flimsy substrates, which in turn can contribute to non-uniform bond line thickness of a paste adhesive, and/or tilted chips during chip mount. Clamps and vacuum apertures in the wire bonder inserts contribute to non uniform heating, as well as broken or poorly formed bonds which is completely unacceptable for reliable, high yield processing.

Not only do the existing bonder work surfaces lack optimum compatibility with current packaging technologies, but also they necessitate a large inventory of device specific parts, and require down time for installation and set-up, which in turn contributes to the cost of assembly, and the device.

In particular, for thin and flexible substrates, it would be advantageous to the industry to have a work station at the chip and wire bond operations which securely holds the device in a planar position, and to have a more universal work station requiring fewer changes than existing wire or die bond equipment.

SUMMARY OF THE INVENTION

It is an object of the invention to provide a work station for both wire bond and for die bond apparatus which securely holds the device under assembly in a planar configuration.

It is further an object of the invention to provide a means for securely holding the device under assembly, without use of clamps.

It is an object of the invention that the work station insert will be used for multiple device types within a package family.

It is an object of the current invention to provide a work station insert which is capable of securing thin, flexible substrates.

It is an object of the invention to provide a work station insert which is compatible with different substrate materials and configurations.

It is an object of the invention to provide a work station for assembly of a plurality of devices within the same indexing operation.

It is an object of the invention that the insert will be compatible with existing assembly equipment, as well as newly designed equipment.

It is an object of the invention to provide a thermally conductive insert for wire bonders.

It is an object of the invention that the work surfaces for both wire bonders and chip bonders be cost effective.

It is an object of the invention that the work stations minimize the need for a large inventory of device specific inserts for either chip bonders or wire bonders.

It is an object of the invention to provide a wire bond work station insert which avoids broken wires caused by release of clamps.

It is an object of the invention to provide a work station insert which will contribute to improved device yield, and reliability by providing more uniform support during processing.

The above and other objectives will be met by providing a porous ceramic vacuum chuck work station for a chip bonder wherein the substrate under assembly is securely and uniformly held by vacuum applied through many tiny pores distributed across the entire surface. Similarly, a wire bond work station insert comprised of porous ceramic having high thermal conductivity is provided, which will secure the device under assembly by application of evenly distributed vacuum to the surface. The inserts are applicable to a family of packages, or to a substrate geometry, thereby eliminating the need for numerous device specific clamps, and frequent change-out and set-up with each chip size and configuration. Elimination of clamps from the bonding process obsoletes the previously troublesome broken wire failure as the clamp is moved.

Application of uniform vacuum as a means for securing the device under assembly supports yield and reliability improvement by eliminating warped substrates, and the resulting non-uniform bond line thickness of the adhesive, and by minimizing tilted die. The uniform vacuum hold down during wire bond eliminates "floating substrates", and the associated failures of lifted stitches and balls.

DETAILED DESCRIPTION OF THE DRAWINGS

Figure 1:
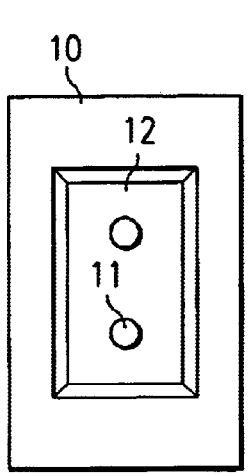
FIG. 1 is a top view of the vacuum chuck for a chip bonder of known art.

FIG. 1 shows a vacuum chuck work holder 10 of a prior art chip-bonder having apertures 11 through which vacuum is applied to secure the substrate of one or more devices under assembly (not shown). The device specific chuck 10 is a metallic device-having a recessed flat surface 12 with one or more apertures 11 attached to a vacuum source. This vacuum chuck mechanism has historically been used with lead frames, and rigid substrates of BGA's (ball grid arrays) or other packages. A rigid substrate may be held in a planar configuration without distortion, however, as substrates of more current semiconductor packages have become thinner, the localized vacuum suction tends to distort the substrate, which in turn, does not allow uniform application of paste type adhesives, and the semiconductor chip or die is not seated horizontally.

Figure 2:
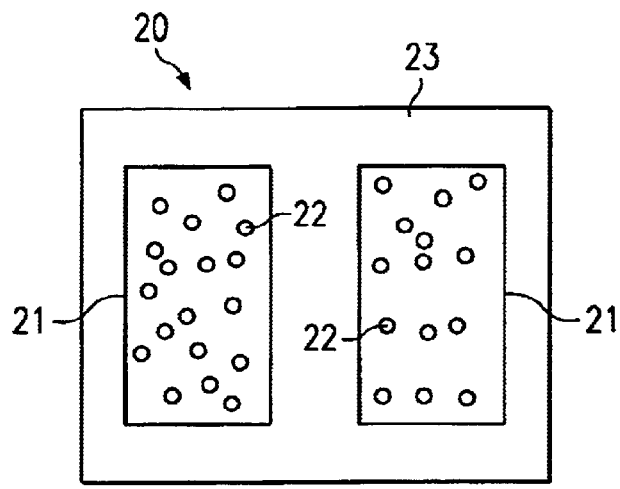
FIG. 2 is a top view of a porous ceramic vacuum chuck for a chip bonder.

FIG. 2 illustrates the current invention wherein two porous ceramic plates 21 are mounted into the work station 20 of a die bonder so that the surface of the plates are flush with the support ring 23 of the work holder. Vacuum is applied uniformly to the surface through many small pores 22 in the ceramic, and the substrate of the device(s) under assembly is securely held in a planar configuration. The ceramic insert 21 of the current invention provides a significant advantage for the assembly of semiconductor packages, such as small BGA's or CSP's (chip scale packages) having flexible film substrates which are readily distorted by clamping or application of localized vacuum. Film or other substrates having multiple devices in the same plane are positioned on the work station, allowing a plurality of chips to be mounted within the same indexing operation.

The porous ceramic insert(s) of the current invention is dimensioned to conform to the design specified for the work station of a given die bonder, and that of a specific package family or substrate size. The porous ceramic plate may be advantageously fitted into existing equipment, or into new equipment designs. The area of the porous ceramic work surface is equal to that of the substrate and its associated planar transport frame or strip, making it useable for many different semiconductor chips within the same package family.

Figure 3:
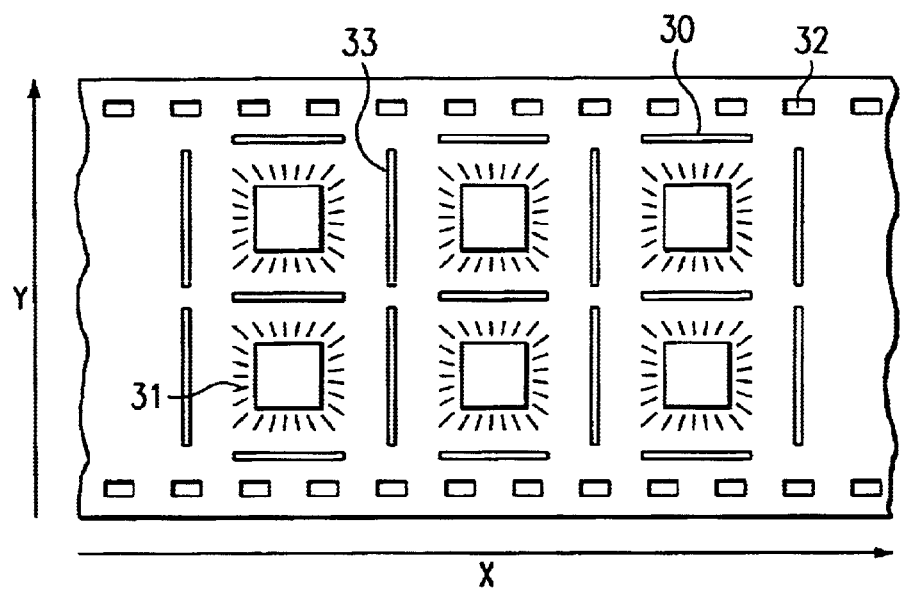
FIG. 3 shows a flex film substrate having both horizontal and vertical device locations. (Known art)

By way of illustration, an embodiment of the die bonder work station in FIG. 2 is provided for a 15×15 mm Chip Scale Package (CSP) family wherein each of the two porous ceramic plates 21 secure two devices, so that four devices are mounted onto the substrate in a single operation before indexing the tape to the next set of devices. A substrate for this package family is a flex tape patterned with two devices in parallel. For clarification, FIG. 3 is an illustration of a typical CSP flex tape substrate 30 having positions and leads 31 for two devices patterned in the "y" direction and a continuous set in the "x" direction. vertically. The tape substrate includes sprocket holes 32 used to transport the tape during assembly operations, and slits 33 between the individual devices will allow ease of separation into individual components. The assembly rate and quality of mounting multiple devices in a single index process is significantly benefited by a uniform vacuum work holder.

Figure 4A:
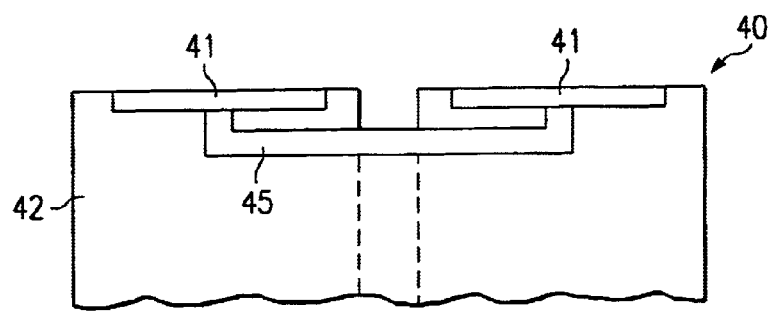
FIG. 4a is cross section of a porous ceramic work station for chip bonder.

FIG. 4a is a cross section of a preferred embodiment of the porous ceramic chip bonder work holder. Each of two porous ceramic plates 41 is press fitted into the base 40 so that the surface is flush with a machined ring 42 in the work holder. The ceramic plates, approximately 2.5 to 2.9 mm in thickness, are connected to a vacuum source by tubes 45 channeled in the base, and the vacuum source (not shown) is controlled by the computer of the automated chip bonder.

Figure 4B:
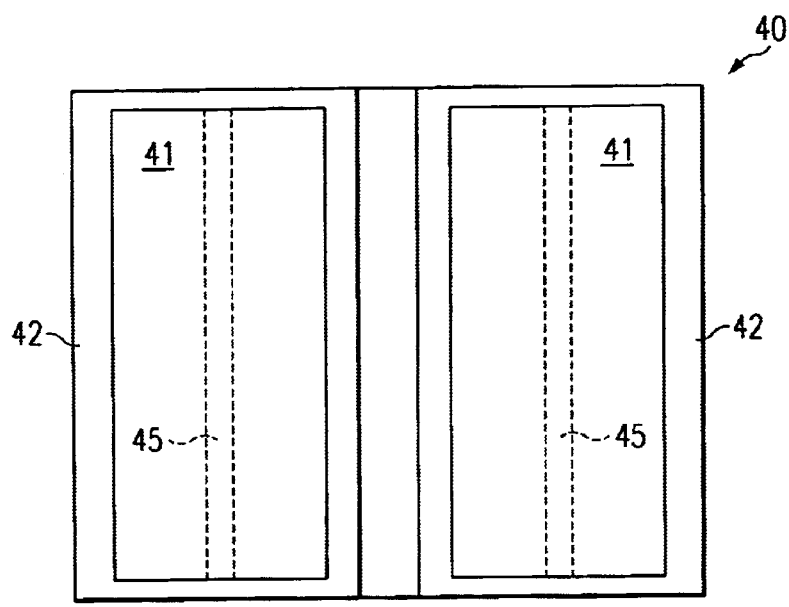
FIG. 4b illustrates the top view of a preferred embodiment of the porous ceramic vacuum chuck.

FIG. 4b provides a top view of the porous ceramic vacuum chuck having vacuum tubes 45 beneath the ceramic plate designated by dashed lines.

In an embodiment of a chip mount work station for a 15×15 mm CSP family, the ceramic comprises a porous alumina (aluminum oxide) of about 2.5 to 2.9 mm thickness, each ceramic plate 41 is about 36 mm in length and 13.75 mm wide, with a 2.5 mm space between the plates. The assemblage having two plates in a work station provides the chip mount work holder for four 15×15 mm molded CSP devices. The steel ring 42 portion of the work holder is about 2 to 2.5 mm.

Many variations of the work station dimensions are to be determined by the device family, by the configuration of the interconnection leads, and or by the substrate dimensions.

Porous ceramic thickness will be somewhat dependent porosity size, pore rate, and flexural strength of the material. In the preferred embodiment, the open pore rate is about 39% and the average pore size about 25 microns.

Figure 5A:
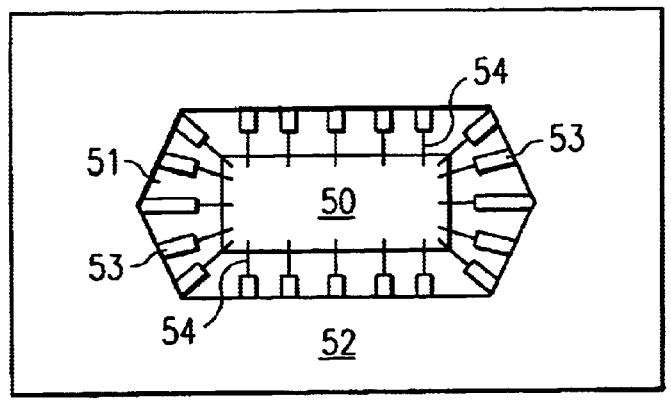
FIGS. 5a and 5b are top and cross sectional views of an insert for a wire bonder of known art.
Figure 5B:
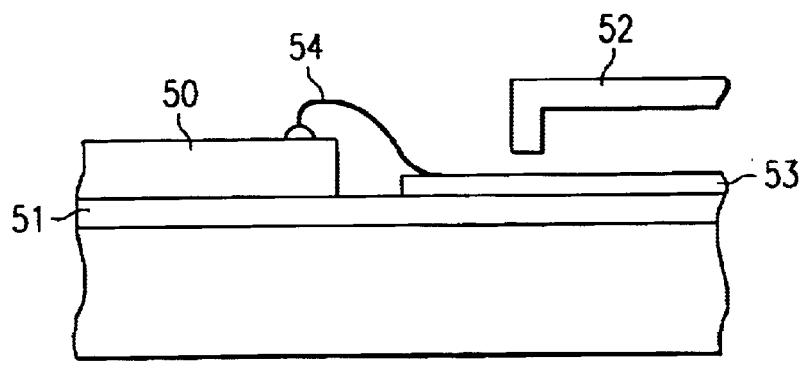

FIGS. 5a and 5b illustrates a typical prior art wire bonder work station having a clamp 52 to secure the substrate 51, onto which a semiconductor device 50 has been attached. In FIG. 5b, wire bond 54 connects semiconductor chip 51 to substrate 51 having leads 53 which are held by clamp 52. Clamp 52, its assembly onto the wire bonder, and its alignment are specific to each chip size and substrate configuration.

Figure 6:
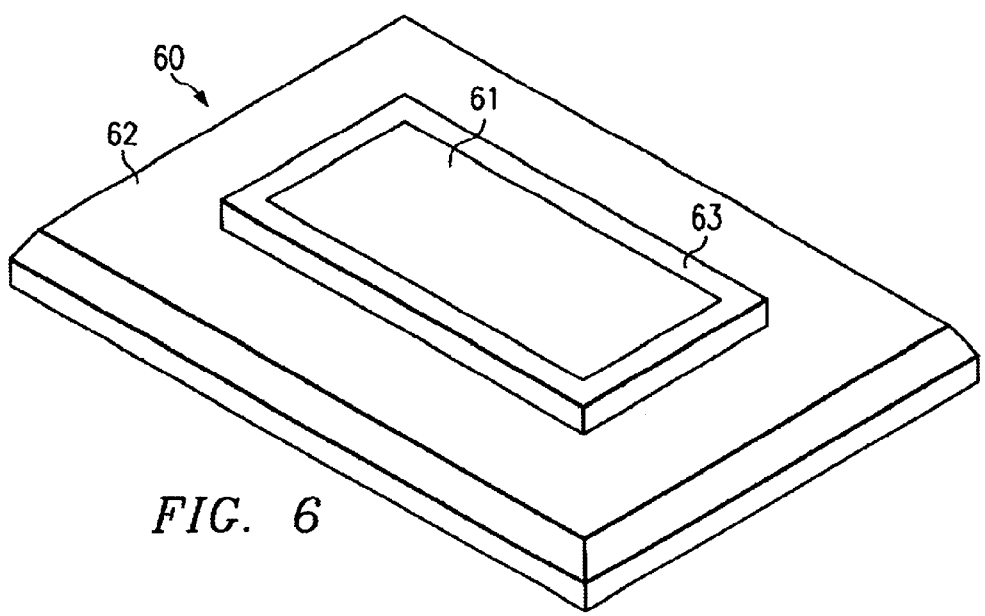
FIG. 6 is an elevation view of a porous ceramic insert for a wire bonder.
Figure 7:
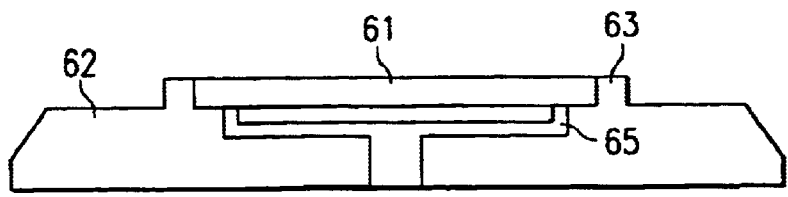
FIG. 7 is a cross section of a porous ceramic insert for a wire bonder.

FIG. 6 illustrates an embodiment of the wire bonder work station of the current invention, having a porous ceramic insert 60. The porous ceramic plate 61 is press fitted into the metal retaining ring 63 of the heater block 62. In FIG. 7, it can be seen that ceramic plate 61 and retaining ring 63 are elevated with respect to the heater block 62. A series of tubes 65 connected to a vacuum source are channeled through the base, and the vacuum pressure is controlled by the computer of the wire bonder. Dimensions of the heater block, and the mechanism for securing it to the bonder are consistent with those designated by a specific wire bonder.

Variations in configuration of the work surface of the assemblage are a function of the package family, and /or substrate dimensions. Package families typically are defined by external dimensions of the device, such as 12×12 mm, or 15×15 mm, and in the case of leaded devices, by the pin count. Alternate embodiments of the work station of the current invention include a work surface configured to support and secure a substrate defined by the area dimensions of the substrate, rather than those of a given packages family. An example of such a work station is one having a single large ceramic plate onto which a 50 mm wide flex tape is secured. The "y" dimension or length of the vacuum chuck is selected based on the number and size of devices to be assembled within the same indexing operation. Porous ceramic work stations may be used in the assembly of one or more devices.

Typically the work station of a wire bonder is heated, and therefore, the preferred porous ceramic has a high thermal conductivity. Aluminum oxide, silicon carbide, silicon nitride, and aluminum nitride are suitable materials for porous ceramic plates, and the specific material selected will be based on bond process temperature requirements. Thermal expansion compatibility of the ceramic to the metal support ring and base is required for high temperature processing. Low thermal expansion ceramics, such as the above mentioned silicon carbide, silicon nitride and aluminum nitride, are compatible with alloys of iron and nickel, while aluminum oxide is compatible with the expansion of steels.

In the preferred embodiment, the porous ceramic plate is about 2.5 to 2.9 mm thick. Pore size is an average of about 25 microns, and the open pore density an average of about 39 percent.

There are numerous advantages of a porous ceramic vacuum support mechanism in a wire bond work station. Among them is the elimination of clamps, thereby avoiding the risk of wire damage as clamps are removed, and further, avoiding a cooling effect of bulky clamps during the bonding process. The multiple pores of the ceramic plates provide secure, planar, and uniform positioning of the device under assembly, which allows more uniform heating and stability to the device, and in turn provides improved yield and reliability of the bond formation. The porous ceramic insert for a wire bonder adds flexibility to the assembly process because it is applicable to multiple substrate materials, and in particular it is advantageous for thin, flimsy materials which are otherwise difficult to secure in a planar position. Further, the planar surface of the porous ceramic allows bonding of multiple devices in a single index process. Equipment cost is significantly reduced by elimination of device specific clamps and inserts, and by the time and labor required for installation, and set-up of a bonder with each device change.

The preferred embodiments for a bonder work station have a porous ceramic plate wherein the surface is in the same horizontal plane as the retaining ring of the base. However, the porous ceramic plate may be formed either in a recessed, or an elevated manner with respect to the retaining ring, and the active work surface elevation and dimensions are set to conform to the substrate geometry.

The inventions have been described with respect to specific embodiments, however, many variations and modifications will immediately become apparent to those skilled in the art. It is, therefore, the intention that the appended claims be interpreted as broadly as possible in view of the prior art to include all such variations and modifications.

What is claimed is:

1. A bonder work station for supporting and securing the substrates of one or more semiconductor devices under assembly, including:
   one or more porous ceramic plates fitted onto a base;
   an exposed horizontal surface of each of said ceramic plates in the same plane as a retaining ring attached to said base; and
   one or more vacuum tubes channeled through said base, and connected to the ceramic plates.

2. A work station as in claim 1 wherein said bonder is a chip mounter/bonder.

3. A work station as in claim 1 wherein said bonder is a wire bonder.

4. A work station as in claim 1 wherein uniform vacuum pressure is applied to the substrate of a device under assembly through pores in said ceramic plate.

5. A work station as in claim 1 wherein the surface of said ceramic plate is flat and parallel to the base.

6. A work station as in claim 1 wherein each of said ceramic plates supports one or more semiconductor devices.

7. A work station as in claim 1 said assemblage functions as a vacuum chuck.

8. A work station as in claim 1 wherein said base is a heater block.

9. A work station as in claim 1 wherein the porous ceramic plate comprises aluminum oxide.

10. A work station as in claim 1 wherein the porous ceramic plate comprises silicon carbide.

11. A work station as in claim 1 wherein the porous ceramic plate comprises aluminum nitride.

12. A work station as in claim 1 wherein the porous ceramic comprises silicon nitride.

13. A work station as in claim 1 wherein said base comprises tooled steel.

14. A work station as in claim 1 wherein said assemblage is retrofitted into an existing bonder.

15. A work station as in claim 1 wherein said assemblage is applicable to the assembly of devices having a flexible tape substrate.

16. A work station as in claim 1 wherein the assemblage applicable to the support of one or more planar substrates.

17. A work station as in claim 1 wherein the ceramic plates are in the range of 2.5 to 2.9 mm thick.

18. A work station as in claim 1 wherein the pore sizes of said ceramic plates are an average of 25 microns in diameter.

19. A work station as in claim 1 wherein the open pore rate of said ceramic plates is an average of 39%.

20. A bonder work station comprising:
   a heater block;
   a ceramic plate fitted into said heater block; and
   one or more vacuum tubes through said heater block and connected to said ceramic plate.

* * * * *